United States Patent
Thomas et al.

(10) Patent No.: US 8,027,799 B2
(45) Date of Patent: Sep. 27, 2011

(54) DIGITAL POTENTIOMETER SYSTEM

(75) Inventors: Robert J. Thomas, Brier, WA (US);
Michael L. Underhill, Bothell, WA (US)

(73) Assignee: Honeywell International Inc.,
Morristown, NJ (US)

( * ) Notice: Subject to any disclaimer, the term of this patent is extended or adjusted under 35 U.S.C. 154(b) by 433 days.

(21) Appl. No.: 11/946,614

(22) Filed: Nov. 28, 2007

(65) Prior Publication Data

US 2009/0134927 A1 May 28, 2009

(51) Int. Cl.
*G01R 35/00* (2006.01)
(52) U.S. Cl. ............... 702/107; 702/57; 702/117
(58) Field of Classification Search .......... 702/57, 702/107, 117; 318/663; 330/108; 324/714, 324/723
See application file for complete search history.

(56) References Cited

U.S. PATENT DOCUMENTS

| | | | | |
|---|---|---|---|---|
| 4,494,082 A | * | 1/1985 | Bennett | 333/28 R |
| 5,243,535 A | | 9/1993 | Bolan et al. | |
| 5,263,089 A | * | 11/1993 | Ribic | 381/320 |
| 5,297,056 A | * | 3/1994 | Lee et al. | 716/1 |
| 5,331,222 A | * | 7/1994 | Lin et al. | 327/554 |
| 5,526,274 A | | 6/1996 | Bolan et al. | |
| 5,717,935 A | * | 2/1998 | Zanders et al. | 713/300 |
| 5,736,895 A | * | 4/1998 | Yu et al. | 327/554 |
| 5,913,181 A | | 6/1999 | Ezell | |
| 5,969,513 A | * | 10/1999 | Clark | 323/282 |
| 6,201,459 B1 | * | 3/2001 | Ioffe et al. | 333/238 |
| 6,320,451 B1 | | 11/2001 | Harvey et al. | |
| 6,462,825 B1 | | 10/2002 | Wiebesick | |
| 6,771,053 B2 | | 8/2004 | Stanescu et al. | |
| 6,809,531 B2 | | 10/2004 | Slye et al. | |
| 7,005,837 B2 | | 2/2006 | Stanescu et al. | |
| 7,012,555 B2 | | 3/2006 | Voicu et al. | |
| 7,042,380 B2 | | 5/2006 | Iacob et al. | |
| 7,164,343 B2 | | 1/2007 | Kessler et al. | |
| 7,345,611 B2 | | 3/2008 | Voicu et al. | |
| 2007/0155347 A1 | * | 7/2007 | Heuermann et al. | 455/107 |
| 2008/0042597 A1 | * | 2/2008 | Hebborn | 315/291 |

* cited by examiner

*Primary Examiner* — Michael Nghiem
*Assistant Examiner* — Elias Desta
(74) *Attorney, Agent, or Firm* — Seager, Tufte & Wickhem LLC

(57) ABSTRACT

A system or circuit for simulating a potentiometer, thermistor, or the like. A pulse stream, having a duty cycle which is varied as a changing pulse width or as a differing number of time slices per time period, may be input to the system. The pulse stream to a transistor or switch-like mechanism may allow a controlled connection of a fixed value resistor to a reference voltage or ground to provide various resultant values of impedance or resistance. A measuring circuit connected to the output of the system may determine a value which is of the fixed value resistor divided by the duty cycle of the pulse train effectively controlling the connection of the resistor to ground. One or more additional circuits may be connected in parallel to achieve greater accuracy.

18 Claims, 3 Drawing Sheets

DIGITAL POTENTIOMETER SYSTEM

BACKGROUND

The invention pertains to electronic components and particularly to impedance devices. More particularly, the invention pertains to digital simulation of variable impedance devices.

SUMMARY

The invention is a digital potentiometer system for simulating such things as a potentiometer, thermistor, and the like.

DESCRIPTION

Figure 1:
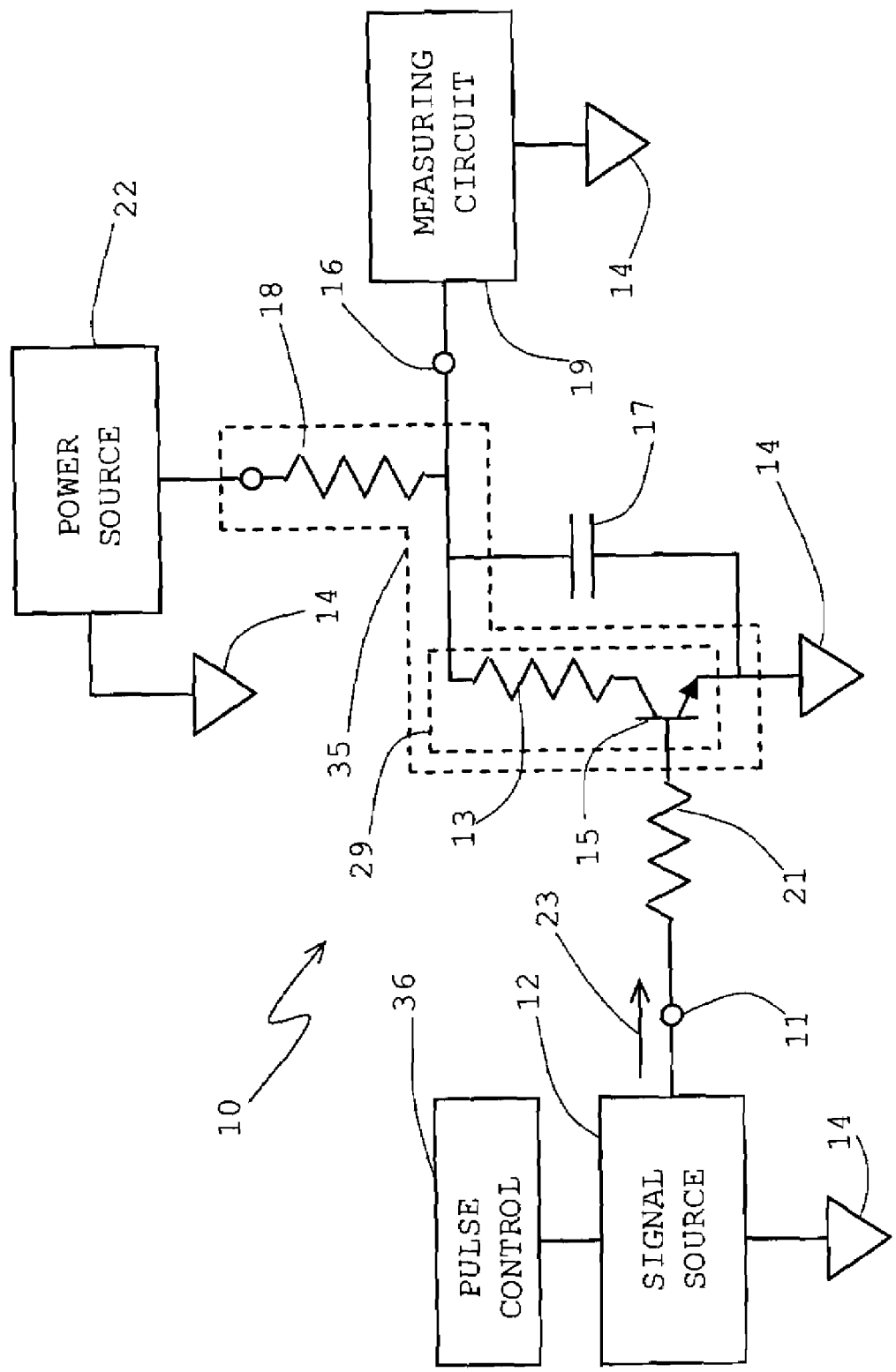
FIG. 1 is a schematic of the digital potentiometer system.
Figure 2:
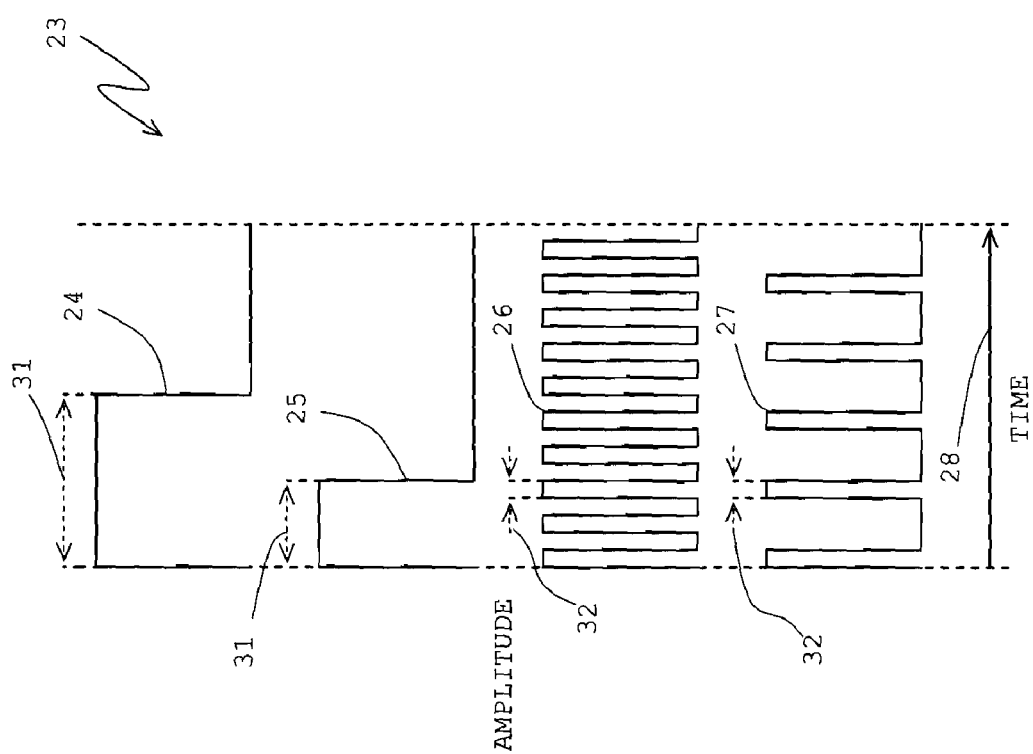
FIG. 2 is a diagram of various waveforms of a pulse stream that may be input to the system shown in FIG. 1.

The invention is a system 10, as shown in FIG. 1, for digitally simulating a potentiometer, thermistor, and the like, when in a particular mode such as that of a voltage divider 35. A pulse train or stream 23 may be provided from a signal generator or source 12 to a terminal 11. The generator 12 may be a processor or other mechanism. A digital potentiometer may be effected by system 10 with pulse-width modulation (PWM). Pulse stream 23 may be varied by increasing and decreasing the pulse width 31 to have a duty cycle from zero to 100 percent. The pulse stream 23 may be varied with a pulse control mechanism 36 connected to the signal source 12. FIG. 2 shows example waveforms graphically in terms of amplitude versus time. For instance, waveforms 24, 25, 26 and 27 may cover one cycle or period 28 of the pulse stream. Waveforms 24 and 25 show one pulse during a period 28. The amount of time (i.e., pulse width 31) that the pulse of waveforms 24 and 25 appears with a higher, for example, voltage relative to a lower voltage (e.g., zero, ground or reference voltage) during the period 28 may be indicative of a duty cycle. Waveforms 24 and 25 appear to have duty cycles of about 50 percent and 25 percent, respectively. As the pulse width 31 varies, the duty cycle may change dynamically from one period or cycle 28 to another period or cycle of the pulse train or stream 23.

The pulse stream or train 23 may instead be a series of time slices or pulses as shown in FIG. 2. Waveforms 26 and 27 may be a series of time slices over a certain period or cycle 28. The slices may have a consistent or fixed size in time, such as a pulse width 32; however, the number of slices or pulses may vary per period 28. For instance, waveform 26 may have ten time slices per period or cycle 28, and waveform 27 may have five time slices for the same period or cycle. An increase of a number of slices may equate to increased effective duty cycle and vice versa. The pulse train or stream 23 may instead consist of other kinds of waveforms (e.g., triangular, sine, or other) of varying magnitudes of amplitude, waveform widths in terms of time, and yet have an effective duty cycle. The effect of various kinds of pulse trains or streams 23 at output 16 may be changed with the pulse control mechanism 36 connected to the signal source 12. However, in keeping with a binary digital form, the waveforms 24-27 may be rectangular pulse type (i.e., high and low, bi-level) signals. Circuit 10 may be regarded as providing a digitization level for dictating a value of impedance or resistance at the output.

Specific voltage magnitudes, pulse widths and time slice sizes of the pulse train or stream waveforms may depend on the parameter values, types of the components in the circuit, and performance factors desired from the digital potentiometer circuit or system 10.

The present circuit 10 may permit the making of a virtual potentiometer by dividing the time which resistor 13 is in the circuit into small slices as discussed herein relative to FIG. 2. A time slice may turn on a transistor 15 which connects one end of resistor 13 to a reference voltage or ground 14. The longer that resistor 13 is connected to ground 14 in the circuit 10, due to a larger number of time slices over a given time period 28, then the resistance value seen at terminal 16 for resistor 13 may approach the fixed value of resistor 13. If there are no time slices for the time period 28, then the output 16 would appear to indicate that resistor 13 is not even in circuit 10, or that it resembles an infinite ohm component or open circuit.

Pulse stream 23 may allow a controlled connection of fixed resistor 13 to a reference voltage or ground 14. A measuring or sensing circuit 19, which detects the value of the digital potentiometer 10 output between terminals 16 and 14, may see a value of the fixed resistor 13 divided by the duty cycle. For instance, if the duty cycle is 100 percent, then the measuring circuit 19 would see approximately the value of the fixed resistor 13. If the duty cycle is 50 percent, then it would see about two times the value of the fixed resistor 13, and so on. The measuring circuit 19 may include an analog-to-digital converter or other mechanism.

The pulse stream 23 may be fed into device 15 via a resistor 21. Device 15 may be a FET, bipolar transistor, or another semiconductor or mechanism. Device 15 may be a switch-like mechanism. A bipolar transistor may used as an illustrative example in FIG. 1. Transistor 15, when turned on, may connect the fixed resistor 13 to ground 14. Another terminal of resistor 13 may be connected to terminal 16 where the digital potentiometer system 10 output can be measured. A resistor 18 may have one end connected to terminal 16 and the other end connected to a power source 22. For example, source 22 may be a positive DC voltage source. A magnitude ($V_S$) of the source output may be about 5 volts, but other voltage levels may be used. Resistor 18 ($R_{18}$) and resistor 13 ($R_{13}$) may form a voltage divider circuit. So the voltage $V_T$ at terminal 16 may be about the same as $V_S$ at source 22 when resistor 13 is not connected to ground 14 by transistor 15. $V_T$ may be about $V_S(R_{13}/(R_{13}+R_{18}))$ when resistor 13 is connected to ground 14. As the connection between the collector and emitter is interrupted, broken, diminished or reduced by the pulse train 23 to the base of transistor 15, the total impedance or resistance 29 ($R_{29}$) of the components between terminals 16 and 14 becomes greater than the fixed value of resistor 13 and thus $V_T$ increases. Here, R18 and R29 may designate the voltage divider 35. Thus, the formula for $V_T$ relative to the dynamic of changing characteristics of pulse train 23 may be stated as $V_S(R_{29}/(R_{29}+R_{18}))$. The voltage drop due to transistor 15 while it is on may be assumed to be negligible, although for greater accuracy of predicted results, the drop may be factored in. Other factors such as impedances due to reactive components in the circuit may be disregarded as being de minimis.

A capacitance or capacitor 17 may be connected across resistor 13 and transistor 15 (i.e., impedance or resistance 29) between terminal 16 and the emitter of transistor 15 or terminal 14. The capacitor symbol 17 of the FIGS. 1 and 3 may represent a distributed capacitance and/or one or more distributed capacitors, and/or one or more lumped capacitances and/or capacitors. A value of the capacitance or capacitor 17 may be selected to minimize the switching noise due to input signals, transistor operation and other component effects, but not such so as to adversely affect a desired overall operation of system 10. Also, the impedances or resistances (e.g., represented by symbols 13, 18, 21, 29, 35) of circuits 10 and 20 may respectively be one or more distributed and/or lumped elements. Terminal 16 relative to terminal 14 may be regarded as an output of system. An input of the measuring circuit 19 may be connected to terminal 16.

Figure 3:
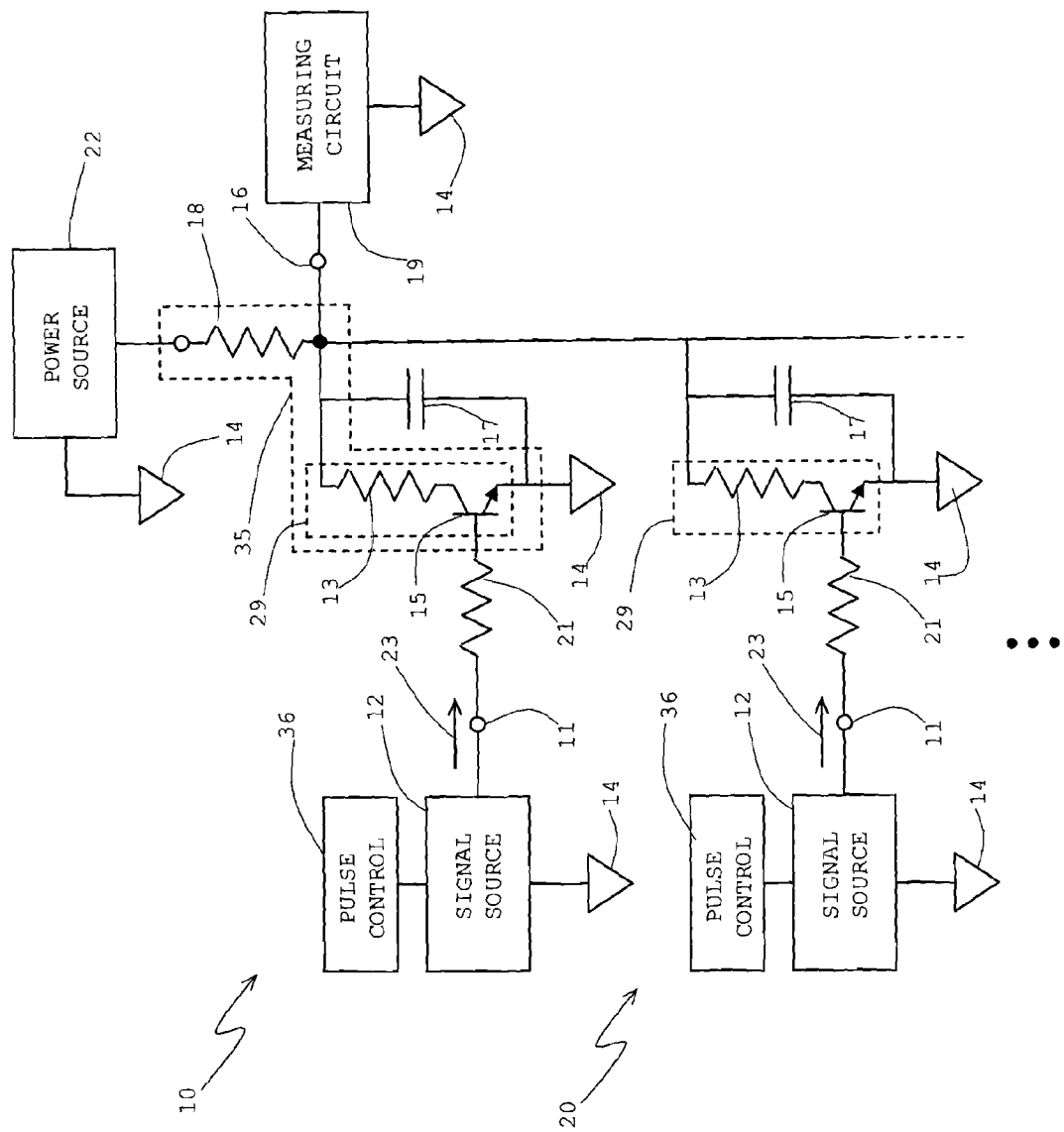
FIG. 3 is a diagram of a multiple digital potentiometer system.

System 10 may be regarded as an adjustable impedance system that provides a level of digitization. Impedance 29 may be digitally prescribed by an input pulse train 23 of PWM pulses, time slices, or some other digital-like signals. Further, as shown in FIG. 3, an additional stage 20 like that of circuit or system 10 may be added to provide additional levels of digitization for an impedance or resistance 29 (incorporating resistor 13 and transistor 15). These two circuits 10 and 20 applied in parallel may achieve greater accuracy in that one of the circuits would provide a rough value and the other circuit would provide fine tuning. Circuit 20 is like that of circuit 10 in terms of components and operation. A common point of circuits 10 and 20, and any additional like circuits that might be added in parallel, is that the impedances 29 of the respective circuits may have a common connection at line or output 16.

Nominal components for circuits 10 and 20 may include a 1K ohm resistor 13, a ten microfarad capacitor 17, a 10K ohm resistor 18 and a 10K ohm resistor 21. Noted values of the components are for illustrative purposes. Other values may be implemented. Transistor 15 may be an NPN type such as a model 2N2222 available from various semiconductor vendors. A semiconductor or mechanism 15 of another type and model may be used in the system or circuits 10 and 20.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. An adjustable impedance system comprising:
a first impedance having a first end and a second end;
a second impedance having a first end connected to the second end of the first impedance, and having a second end;
a switch having a first terminal connected to the second end of the second impedance, and having second and third terminals; and
a capacitance having a first terminal connected to the first end of the second impedance and a second terminal connected to the third terminal of the switch; and
wherein:
the second terminal of the switch is an input for a signal to control a connection between the first and third terminals of the switch;
to control the connection between the first and third terminals of the switch is to control a third impedance between the first end of the second impedance and the third terminal of the switch, wherein the capacitance is in parallel with the third impedance; and
each of the first and second impedances comprises one or more resistors.

2. The system of claim 1, further comprising:
a fourth impedance having a first end connected to the second end of the first impedance, and having a second end; and
a second switch having a first terminal connected to the second end of the fourth impedance, and having second and third terminals; and
wherein:
the second terminal of the second switch is an input for a signal to control a connection between the first and third terminals of the second switch; and
to control the connection between the first and third terminals of the second switch is to control a fifth impedance between the first end of the fourth impedance and the third terminal of the second switch.

3. The system of claim 1, wherein:
the first end of the first impedance is for connection to a first voltage; and
the third terminal of the switch is for connection to a second voltage.

4. The system of claim 1, wherein:
the switch is a semiconductor.

5. The system of claim 4, wherein:
the signal comprises a duty cycle; and
a size of the duty cycle determines a magnitude of the third impedance.

6. The system of claim 5, wherein:
the signal comprises a stream of pulses;
a temporal size of each pulse determines the size of the duty cycle.

7. An adjustable impedance system comprising:
a first impedance having a first end and a second end;
a second impedance having a first end connected to the second end of the first impedance, and having a second end; and
a switch having a first terminal connected to the second end of the second impedance, and having second and third terminals; and
wherein:
the second terminal of the switch is an input for a signal to control a connection between the first and third terminals of the switch; and
to control the connection between the first and third terminals of the switch is to control a third impedance between the first end of the second impedance and the third terminal of the switch;
each of the first and second impedances comprises one or more resistors;
the switch is a semiconductor;
the signal comprises a duty cycle;
a size of the duty cycle determines a magnitude of the third impedance;
the signal comprises a stream of time slices; and
a number of time slices per period of time effectively determines the size of the duty cycle.

8. The system of claim 5, wherein the semiconductor is selected from a group consisting of bipolar transistors and FETs.

9. The system of claim 7, further comprising a capacitance connected in parallel with the third impedance.

10. The system of claim 5, wherein:
the signal is digital;
an output is across the third impedance; and
the output is for providing a digital impedance simulation in accordance with the signal.

11. The system of claim 10, wherein the impedance simulation is that of a potentiometer or a thermistor.

12. The system of claim 10, wherein:
the impedance system provides a level of digital adjustment; and
the system further comprises one or more additional impedance systems connected in parallel with the system for more levels of adjustment.

13. A method of providing a variable resistance, comprising:
connecting first and second resistances in a series having a first end, a common connection and a second end;
connecting a first terminal of a switch to the second end of the series;
connecting the first end of the series to a first voltage terminal;
connecting a third terminal of the switch to a second voltage terminal, wherein a third resistance is between the common connection and the third terminal of the switch;
connecting a second terminal of the switch to a signal source for controlling a connection between the first and third terminals of the switch; and
connecting a first terminal of a capacitive element to the common connection and a second terminal of the capacitive element to the third terminal of the switch.

14. The method of claim 13, wherein:
a magnitude of the third resistance is determined by the connection between the first and third terminals of the switch.

15. The method of claim 14, further comprising:
providing a signal from the signal generator to the second terminal of the switch; and
wherein:
the signal comprises train of pulses having a duty cycle;
the duty cycle is between equal to or greater than zero percent and equal to or less than one-hundred percent;
the duty cycle is determinative of an amount of connection between the first and third terminals of the switch; and
the amount of connection affects the magnitude of the third resistance.

16. The method of claim 15, wherein the switch comprises a semiconductor.

17. A digital potentiometer system comprising:
a first resistor having first and second ends;
a second resistor having a first end connected to the second end of the first resistor, and having a second end;
a semiconductor having a first terminal connected to the second end of the second resistor, and having second and third terminals; and
a capacitance connected between the first end of the second resistor and the third terminal of the semiconductor; and
wherein:
the second and third terminals of the semiconductor are for receiving signals having a duty cycle; and
the duty cycle can be modulated to adjust an amount of resistance between the first end of the second resistor and the third terminal of the semiconductor.

18. The system of claim 17, wherein:
an output is between the first end of the second resistor and the third terminal of the semiconductor;
the first end of the first resistor is connected to a first voltage terminal; and
the third element of the semiconductor is connected to a second voltage terminal.

* * * * *